(12) United States Patent
Lin et al.

(10) Patent No.: US 8,420,954 B2
(45) Date of Patent: Apr. 16, 2013

(54) PRINTED CIRCUIT BOARD AND METHOD FOR FABRICATING THE SAME

(75) Inventors: Hsien-Chieh Lin, Taoyuan County (TW); Tung-Yu Chang, Taoyuan County (TW)

(73) Assignee: Nan Ya PCB Corp., Taoyuan County (TW)

( * ) Notice: Subject to any disclaimer, the term of this patent is extended or adjusted under 35 U.S.C. 154(b) by 305 days.

(21) Appl. No.: 12/956,724

(22) Filed: Nov. 30, 2010

(65) Prior Publication Data

US 2012/0043127 A1 Feb. 23, 2012

(30) Foreign Application Priority Data

Aug. 20, 2010 (TW) ................................ 99127897 A

(51) Int. Cl.
*H05K 1/11* (2006.01)

(52) U.S. Cl.
USPC ....... 174/266; 174/15.1; 174/17 LF; 174/252; 174/260; 361/761; 29/847

(58) Field of Classification Search ................. 174/15.1, 174/15.2, 16.3, 17.06, 17.07, 17 LF, 547, 174/548, 252, 260, 265, 266; 361/761; 29/846, 29/847

See application file for complete search history.

(56) References Cited

U.S. PATENT DOCUMENTS

| 5,801,442 | A | * | 9/1998 | Hamilton et al. | 257/714 |
| 6,166,937 | A | * | 12/2000 | Yamamura et al. | 363/141 |
| 6,257,310 | B1 | * | 7/2001 | Janko | 164/61 |
| 7,110,258 | B2 | * | 9/2006 | Ding et al. | 361/699 |
| 7,174,738 | B2 | * | 2/2007 | Scott | 62/259.2 |
| 7,215,547 | B2 | * | 5/2007 | Chang et al. | 361/701 |

* cited by examiner

*Primary Examiner* — Hoa C Nguyen

(57) ABSTRACT

The invention provides a printed circuit board and a method for fabricating the same. The printed circuit board includes a core substrate having a first surface and an opposite second surface. A first through hole and a second through hole are formed through a portion of the core substrate, respectively from the first surface and second surfaces, wherein the first and second through holes are laminated vertically and connect to each other. A first guide rail and a second guide rail are, respectively, formed through a portion of the core substrate and connected to the second through hole, so that a fluid flows sequentially from an outside of the printed circuit board through the first guide rail, the second through hole and the second guide rail, to the outside of the printed circuit board.

16 Claims, 13 Drawing Sheets

PRINTED CIRCUIT BOARD AND METHOD FOR FABRICATING THE SAME

CROSS REFERENCE TO RELATED APPLICATIONS

This application claims priority of Taiwan Patent Application No. 099127897, filed on Aug. 20, 2010, the entirety of which is incorporated by reference herein.

BACKGROUND OF THE INVENTION

1. Field of the Invention

The present invention relates to a printed circuit board, and in particular, to a printed circuit board with a heat dissipation structure and semiconductor components embedded therein.

2. Description of the Related Art

For conventional printed circuit board structures, a semiconductor device and a carrier are formed as a package using a flip chip (FC) method or a wire binding (WB) method. Also, the FC or WB method is used to laminate or assemble more than one package on a surface of a single carrier. However, due to miniaturization, difficulties arise when designing the circuit layout of printed circuit boards due to circuit connection requirements of the semiconductor devices which are packaged. Therefore, printed circuit boards with semiconductor components embedded therein, which encloses semiconductor devices within a carrier have been developed.

Due to high operating frequencies of electronic devices and increased amount of semiconductor components comprising active and passive devices assembled on a single carrier, heat generated from the semiconductor components have increased dramatically. Accordingly, reliability of conventional semiconductor components may decrease due to poor heat dissipation. Therefore, it has become important to design a printed circuit board with a heat dissipation structure and semiconductor components embedded therein.

Thus, a novel printed circuit board is desired to overcome the aforementioned problems.

BRIEF SUMMARY OF INVENTION

A printed circuit board and method for fabricating the same are provided. An exemplary embodiment of a printed circuit board comprises a core substrate having a first surface and an opposite second surface. A first through hole and a second through hole are formed through a portion of the core substrate, respectively from the first surface and second surface, wherein the first and second through holes are laminated vertically and communicate with each other. A first guide rail and a second guide rail are, respectively formed through a portion of the core substrate and communicate with the second through hole, so that a fluid flows from an outside of the printed circuit board through the first guide rail, the second through hole and the second guide rail, to the outside of the printed circuit board in sequence, so that heat generated from a semiconductor device disposed in the first through hole is transmitted to the outside of the printed circuit board.

An exemplary embodiment of a method for fabricating a printed circuit board comprises providing a core substrate having a first surface and an opposite second surface. A portion of the core substrate is removed from the first surface to form a first through hole in the core substrate. A portion of the core substrate is removed from the second surface to form a second through hole, a first guide rail and a second guide rail in the core substrate, wherein the first and second through holes are laminated vertically and communicate with each other, and the first guide rail and the second guide rail, respectively communicate with the second through hole, so that a fluid flows from an outside of the printed circuit board through the first guide rail, the second through hole and the second guide rail, to the outside of the printed circuit board in sequence, and heat generated by operating a semiconductor device disposed in the first through hole is transmitted to the outside of the printed circuit board.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIGS. 2b, 4b, 5b and 6b are bottom views of FIGS. 2a, 4a, 5a and 6a.

FIGS. 8b, 10b and 11b are bottom views of FIGS. 8a, 10a and 11a.

DETAILED DESCRIPTION OF INVENTION

Figure 1:
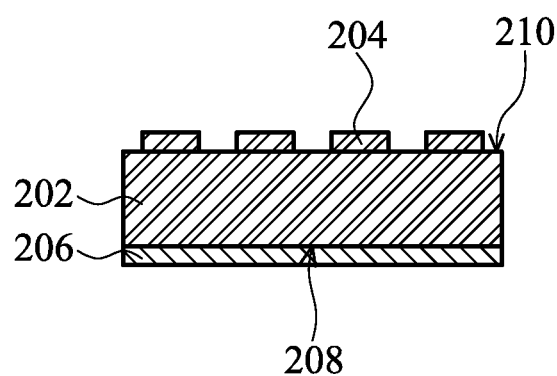
FIGS. 1, 2a, 3, 4a, 5a and 6a are cross section views for fabricating one exemplary embodiment of a printed circuit board of the invention.

The following description is of a mode for carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

The present invention will be described with respect to particular embodiments and with reference to certain drawings, but the invention is not limited thereto and is only limited by the claims. The drawings described are only schematics and are non-limiting. In the drawings, the size of some of the elements may be exaggerated and not drawn to scale for illustrative purposes. The dimensions and the relative dimensions do not correspond to actual dimensions to practice the invention.

FIGS. 1, 2a, 3, 4a, 5a and 6a are cross section views for fabricating one exemplary embodiment of a printed circuit board of the invention. FIGS. 2b, 4b, 5b and 6b are bottom views of FIGS. 2a, 4a, 5a and 6a. One exemplary embodiment of a printed circuit board of the invention is a semiconductor component embedded printed circuit board with a heat dissipation structure. FIG. 1 illustrates a semiconductor device 202 embedded in one exemplary embodiment of a printed circuit board of the invention. In one embodiment, the semiconductor device 202 may comprise active devices, for example, transistors or bipolar devices, or passive devices, for example, resistors, capacitors or inductors. As shown in FIG. 1, a plurality of conductive pads 204 may be disposed on a top surface 210 of the semiconductor device 202. Additionally, a heat conductive metal layer 206 may be disposed on a bottom surface 208 of the semiconductor device 202, wherein the heat conductive metal layer 206 is electrically isolated from the semiconductor device 202. In one embodiment, the heat conductive metal layer 206 may comprise Ni, Au, Sn, Pb, Cu, Al, Ag, Cr, W, or Si, or combinations thereof, or alloys thereof.

Figure 2A:
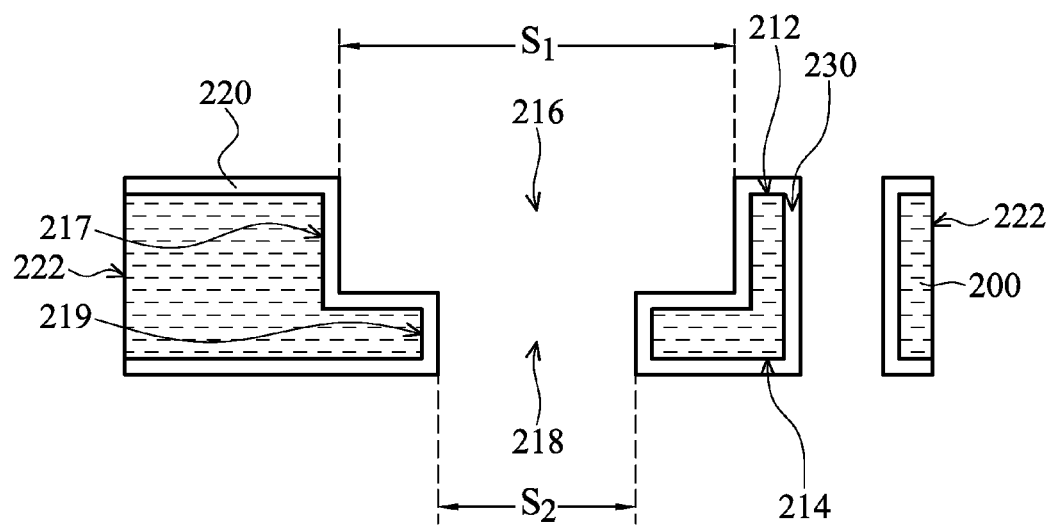
Figure 2B:
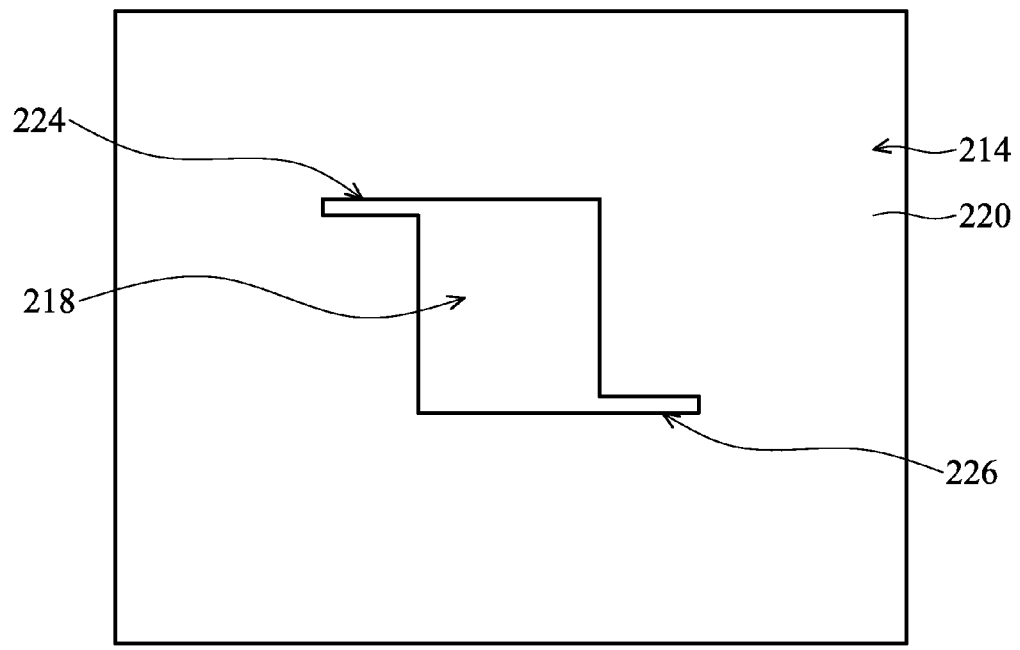

Referring to FIGS. 2a and 2b, a core substrate 200 having a first surface 212, an opposite second surface 214 and a side surface 222 adjacent to both of the first surface 212 and the second surface 214 is provided. In one embodiment, materials of the core substrate 200 may comprise a paper phenolic resin, a composite epoxy, a polyimide resin or a glass fiber core material. Next, a portion of the core substrate 200 is removed from the first surface 212 to form a first through hole 216 in the core substrate 200 by physical processes such as a mechanical drilling or a laser drilling process, wherein the first through hole 216 is formed from the first surface 212 extending downward into the core substrate 200. Additionally, a portion of the a core substrate 200 is removed from the second surface 214 to form a second through hole 218, a first guide rail 224 and a second guide rail 226 in the core substrate 200, which are formed from the second surface 214 extending upward into the core substrate 200, in the core substrate 200. As shown in FIG. 2a, the first through hole 216 and the second through hole 218 are laminated vertically and communicate with each other, wherein a first caliber $S_1$ of the first through hole 216 is larger than a second caliber $S_2$ of the second through hole 218. Also, as shown in FIG. 2b, the first guide rail 224 and the second guide rail 226 are, respectively adjacent to a same side or different sides of the second through hole 218, while communicating with the second through hole 218. In one embodiment, heights and widths of the first guide rail 224 and the second guide rail 226 are all smaller than those of the second through hole 218. During physical processes such as mechanical drilling or laser drilling processes, a through hole 230 may by formed through the core substrate 200.

Next, referring to FIGS. 2a and 2b again, a seed layer (not shown) may be conformably formed on the core substrate 200, covering the first surface 212, the second surface 214, an inner sidewall 217 of the first through hole 216, an inner sidewall 219 of the second through hole 218, the first guide rail 224, the second guide rail 226, and an inner sidewall of the through hole 230 by coating, chemical vapor deposition (CVD) or physical vapor deposition (PVD) methods such as sputtering In one embodiment, the seed layer is a thin layer comprising Ni, Au, Sn, Pb, Cu, Al, Ag, Cr, W, or Si, or combinations thereof, or alloys thereof. The seed layer facilitates the nucleation and growing of subsequent metal layers formed by the electro plating process. Next, a first electroplated metal layer 220 may be conformably formed on the seed layer, covering the first surface 212, the second surface 214, the inner sidewall 217 of the first through hole 216, the inner sidewall 219 of the second through hole 218, the first guide rail 224, the second guide rail 226, and an inner sidewall of the through hole 230 by an electroplating process. In one embodiment, materials of the first electroplated metal layer 220 may be the same as those of the seed layer.

Figure 3:
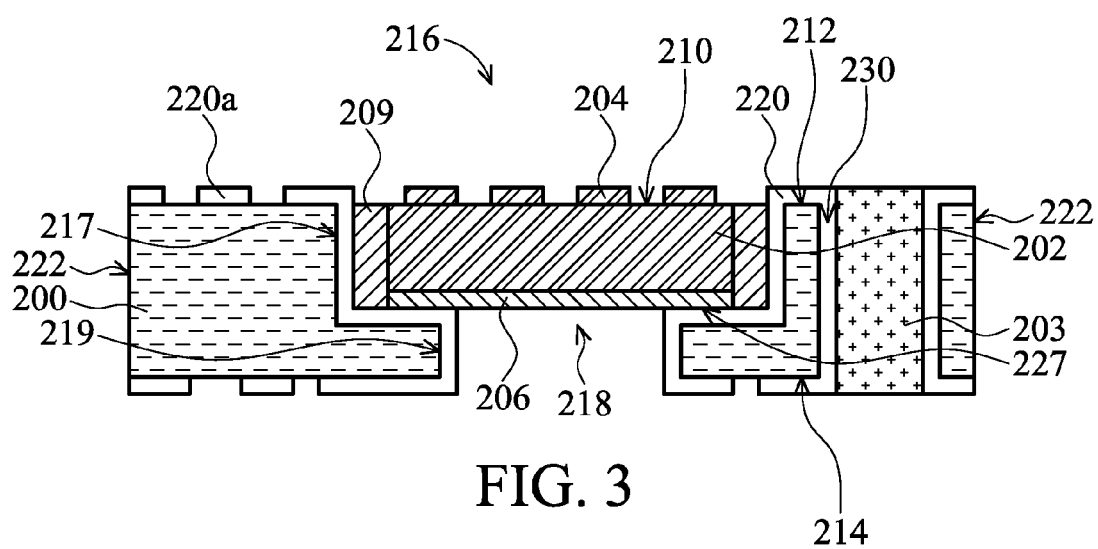

Next, referring to FIG. 3, the semiconductor device 202 as shown in FIG. 1 is disposed in the first through hole 216. Because the first caliber $S_1$ of the first through hole 216 may be larger than the second caliber $S_2$ of the second through hole 218, the semiconductor device 202 may be supported by a bottom surface 227 of the first through hole 216, and a portion of the heat conductive metal layer 206 will be exposed from the second through hole 218. As shown in FIG. 3, a size of the semiconductor device 202 may be smaller than that of the first through hole 216, so that a heat conductive glue 209 can be used to fill a space between the semiconductor device 202 and the inner sidewall 217 of the first through hole 216. The heat conductive glue 209 is used to fix the semiconductor device 202 and facilitate the transmission of heat generated from the semiconductor device 202 to the adjacent first electroplated metal layer 220. Additionally, a through hole resin 203 may be formed in the through hole 230.

Next, referring to FIG. 3 again, a portion of the first electroplated metal layer 220 is removed by an image transferring process, which comprises the covering, developing, etching and stripping processes of a photoresist layer to form a patterned first electroplated metal layer 220a on the first surface 212 and the second surface 214 of the core substrate 200. The patterned first electroplated metal layer 220a may also serve as an internal circuit layer 220a.

Figure 4A:
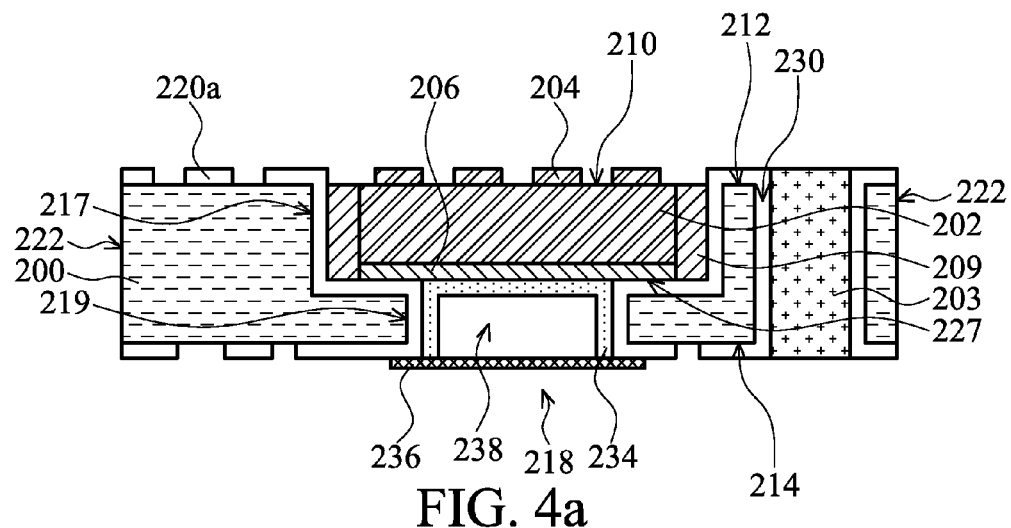
Figure 4B:
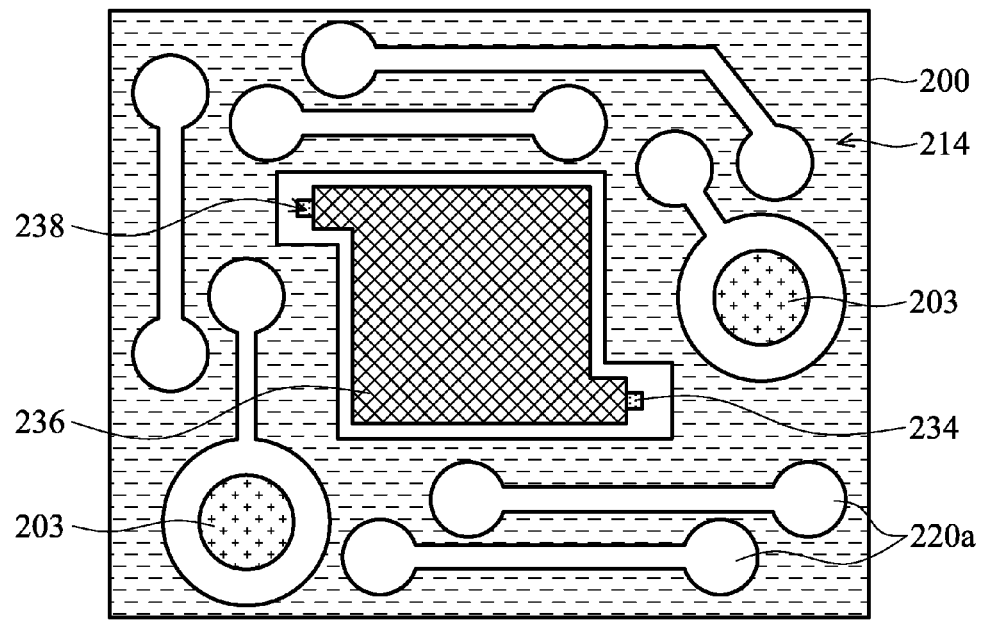

Next, referring to FIGS. 4a and 4b, a second electroplated metal layer 234 is formed on the patterned first electroplated metal layer 220a in the second through hole 218, the first guide rail 224 and the second guide rail 226 and the heat conductive metal layer 206 is exposed from the second through hole 218 by an electro plating process. In one embodiment, the second electroplated metal layer 234 and the first electroplated metal layer 220 may be formed by the same materials. Next, a water resistant glue 236 is formed covering the second through hole 218, the first guide rail 224 and the second guide rail 226, extending to portions of the first electroplated metal layer 220a and the second electroplated metal layer 234 on the second surface 214 of the core substrate 200. The water resistant glue 236 contacts the second electroplated metal layer 234 covering inner sidewalls of the second through hole 218, the first guide rail 224 and the second guide rail 226, and a space encircled by the water resistant glue 236 and the second electroplated metal layer 234 is formed as a flow path 238, thereby facilitating transmission of a fluid, which would flow therethrough the flow path 238 and cool core substrate 200, without the fluid permeating into the core substrate 200.

Figure 5A:
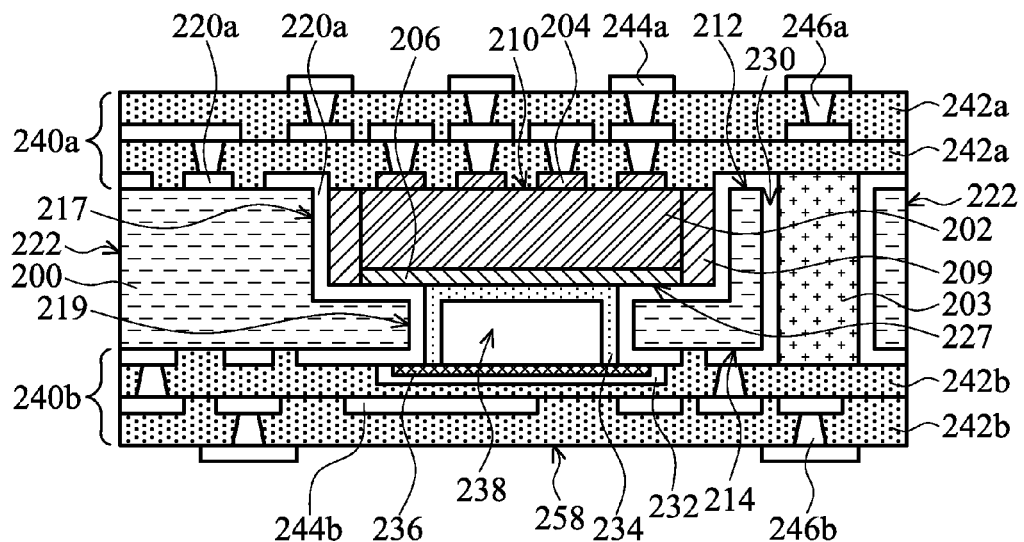

Next, referring to FIG. 5a, a patterned photoresist (not shown) is formed on the second surface 214 of the core substrate 200 by an image transferring process, which comprises covering, developing, etching and stripping processes of a photoresist layer. All portions of the water resistant glue 236 and a portion of the first electroplated metal layer 220a adjacent to the water resistant glue 236 are exposed from the patterned photoresist (not shown). Next, a third electroplated metal layer 232 is formed on the water resistant glue 236, covering a portion of the first electroplated metal layer 220a adjacent to the water resistant glue 236 by an electro plating process. In one embodiment, the third electroplated metal layer 232 is used to enhance the sealing ability provided by the water resistant glue 236, thereby facilitating transmission of a fluid, which would flow therethrough the flow path 238 and cool core substrate 200, without the fluid permeating into the core substrate 200 In one embodiment, the second electroplated metal layer 234, the first electroplated metal layer 220 and the third electroplated metal layer 232 may be formed by the same materials.

Next, referring to FIGS. 5a and 5b again, a first additional circuit structure 240a and a second additional circuit structure 240b are, respectively formed on the first surface 212 and second surface 214. The first additional circuit structure 240a covers the first through hole 216 and the semiconductor device 202, and the second additional circuit structure 240b covers the second through hole 218, the first guide rail 224 and the second guide rail 226. The first additional circuit structure 240a may comprise a plurality of insulating layers 242a, which are laminated vertically, a plurality of patterned circuit layers 244a formed between the insulating layers 242a and a plurality of conductive blind holes 246a, which are used to electrically connect to the patterned circuit layers 244a of different levels, through the insulating layers 242a. Similarly, the second additional circuit structure 240b may comprise a plurality of insulating layers 242b, which are laminated vertically, a plurality of patterned circuit layers 244b formed between the insulating layers 242b and a plurality of conductive blind holes 246b, which are used to electrically connect to the patterned circuit layers 244b of different levels, through the insulating layers 242b. The first additional circuit structure 240a and the second additional circuit structure 240b electrically connect to the conductive pads 204 of the semiconductor device 202 through the patterned circuit layers 244a, 244b and the blind holes 246a, 246b.

Figure 5B:
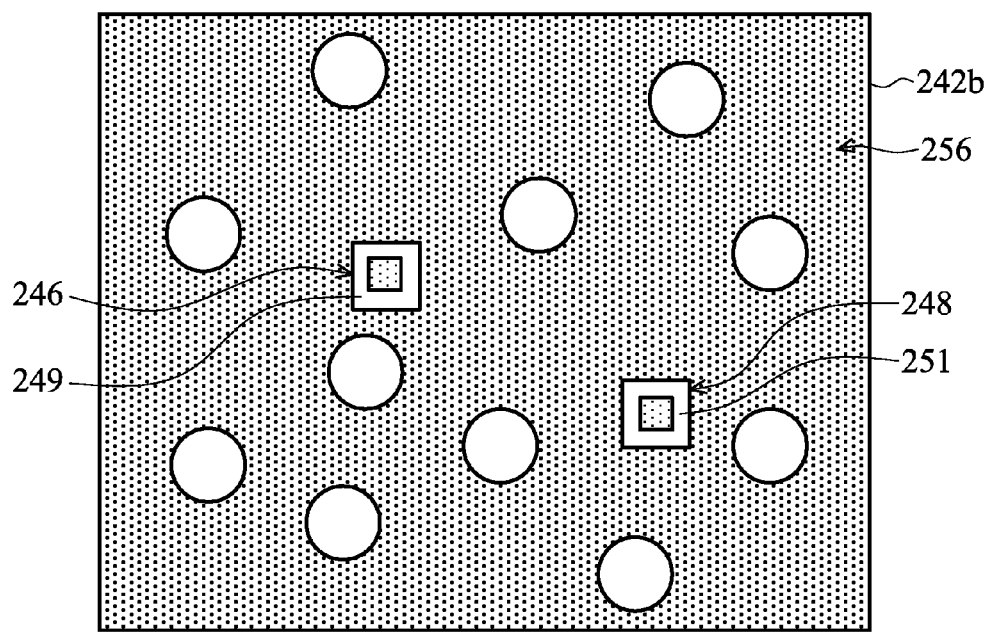

It is noted that during formation of the second additional circuit structure 240b, for example, during formation of the plurality of blind holes in the insulating layers 242b to provide positions for subsequently formed conductive blind holes 246b by laser drilling, a first flow path hole 246 and a second flow path hole 248 may be formed at the same time to respectively communicate with the first guide rail 224 and the second guide rail 226 of the flow path 238, wherein a terminal opening of the first flow path hole 246 and a terminal opening of the second flow path hole 248 (i.e. opening portions of the first flow path hole 246 and the second flow path hole 248 as shown in FIG. 5b) are respectively on a top surface 256 of the second additional circuit structure 240b. Additionally, during formation of the blind holes 246b, in the positions of the blind holes formed by an image transferring process and an electro plating process, a fourth electroplated metal layer 249 and a fifth electroplated metal layer 251 are, respectively formed covering inner sidewalls of the first flow path hole 246 and the second flow path hole 248 at the same time. Note that the fourth electroplated metal layer 249 and the fifth electroplated metal layer 251 do not entirely fill the first flow path hole 246 and second flow path hole 248. The flow path 238 may be further extended to the top surface 256 of the second additional circuit structure 240b by the first flow path hole 246 and the second flow path hole 248, which communicate with the first guide rail 224 and the second guide rail 226. In one embodiment, the fourth electroplated metal layer 249 and the fifth electroplated metal layer 251 may be formed of the same materials, and communicate with the first electroplated metal layer 220 and the second electroplated metal layer 234.

Figure 6A:
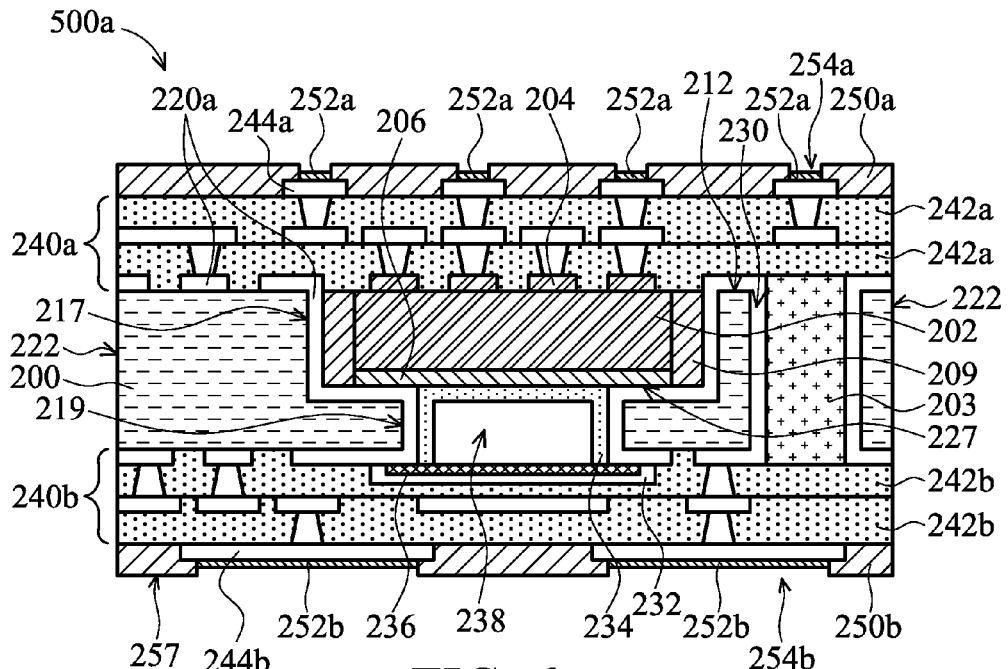
Figure 6B:
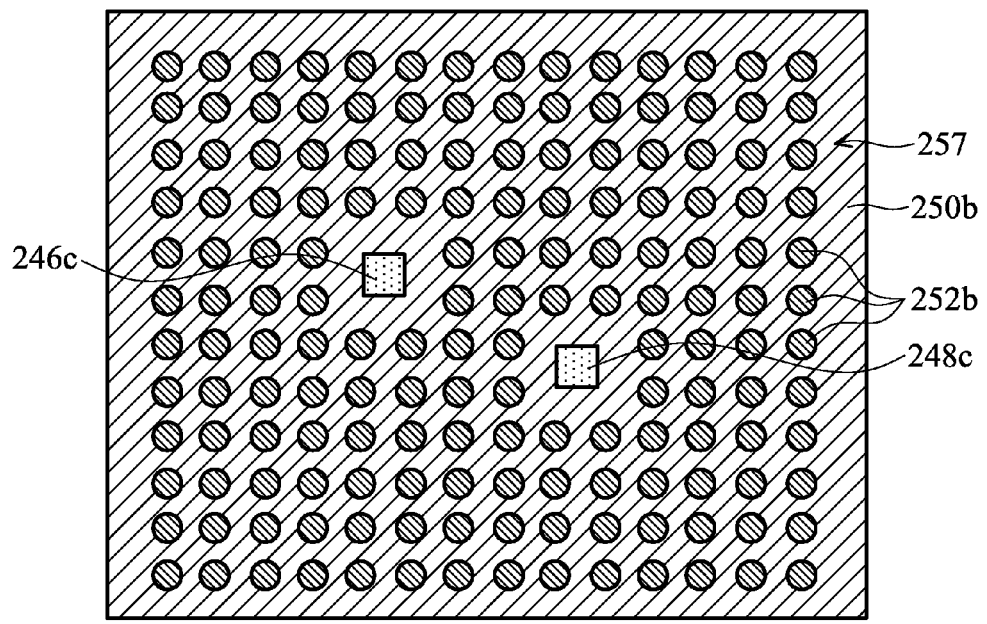

Next, referring to FIGS. 6a and 6b, solder resistance insulating layers 250a and 250b may be formed, respectively, on the first additional circuit structure 240a and the second additional circuit structure 240b by a coating, printing, pasting or laminating method. Next, a plurality of openings 254a and 254b may be optionally and respectively formed in the solder resistance insulating layers 250a and 250b by a laser drilling, plasma etching or image transfer opening process to expose portions of the patterned circuit layers 244a and 244b. During formation of the openings 254a and 254b, the openings 246c and 248c, respectively, exposing the first flow path hole 246 and the second flow path hole 248, are formed directly on the first flow path hole 246 and the second flow path hole 248 at the same time, so that the flow path 238 may be extended to a top surface 257 of the solder resistance insulating layer 250b, for external contact of the first flow path hole 246, the second flow path hole 248 and the openings 246c and 248c. In one embodiment, the solder resistance insulating layers 250a and 250b may comprise solder resistance materials such as a solder mask, or insulating materials comprising polyimide, an ajinomoto build-up (ABF) film or polypropylene (PP). The solder resistance insulating layers 250a and 250b may protect the underlying conductive blind holes 246a, 246b and the patterned circuit layers 244a, 244b from oxidation and short circuiting. Additionally, the openings 254a and 254b through the solder resistance insulating layers 250a and 250b may provide the positions of subsequently formed solder bumps. Next, metal protection layers 252a and 252b are respectively formed on the patterned circuit layers 244a and 244b, which are respectively exposed from the openings 254a and 254b. In one embodiment, the metal protection layers 252a and 252b may comprise Ni, Au, Sn, Pb, Al, Ag, Cr, W, or Pa or combinations thereof, or alloys thereof. The metal protection layers 252a may increase the bonding force between subsequently formed solder bumps and the patterned circuit layers 244a and 244b. Note that the description of one exemplary embodiment of a printed circuit board 500a of the invention has been completed.

Figure 7:
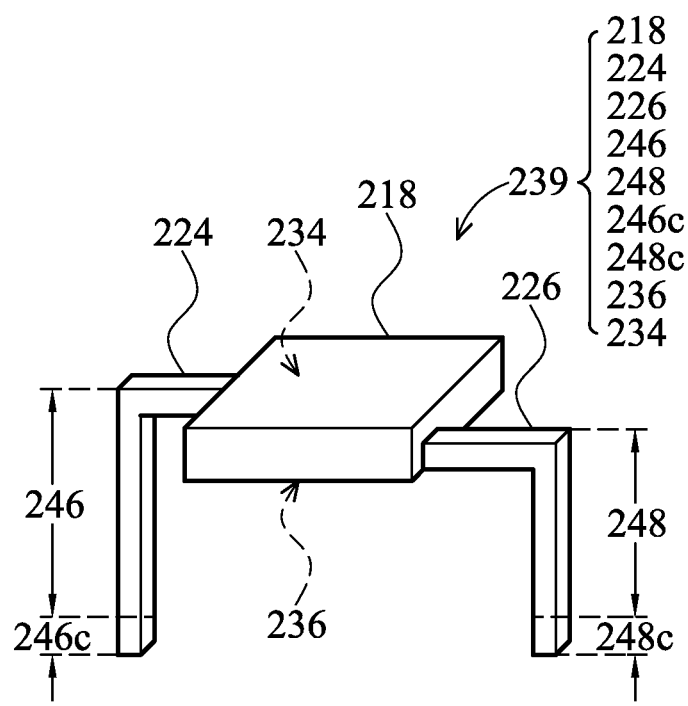
FIG. 7 is a three-dimensional schematic view showing a flow path formed by a second through hole, a first guide rail, a second guide rail, a first flow path hole and a second flow path hole of one exemplary embodiment of a printed circuit board of the invention.

As shown in FIG. 7, in one exemplary embodiment of a printed circuit board 500a of the invention, the flow path 238 (comprising the second through hole 218, the first guide rail 224 and the second guide rail 226, which are covered by the water resistant glue 236, and the second electroplated metal layer 234), the first flow path hole 246, the second flow path hole 248 and the openings 246c and 248c, which communicate with the flow path 238, are formed as a hollow flow path 239, so that a fluid having a cooling function, for example, methanol or water, may flow sequentially from an outside of the printed circuit board through the opening 246c of the flow path 239 (serving as an entry point of the fluid), then through the first flow path hole 246, the first guide rail 224, the second through hole 218, the second guide rail 226, the second flow path hole 248 and the opening 248c of the flow path 239 (serving as an outlet of the fluid) to the outside of the printed circuit board, so that heat generated from the semiconductor device 202 disposed in the first through hole 216 is transmitted to the outside of the printed circuit board. It is to be understood that the invention is not limited to the disclosed embodiments. Alternatively, the opening 248c may serve as an entry point of the fluid and the opening 246c may serve as an outlet of the fluid. Note that the printed circuit board 500a may communicate with an additional fluid circulation cooling device such as a cooling pump, so that the fluid in the printed circuit board can be transmitted to the outside of the printed circuit board to increase cooling efficiency. Also, fluid with a lower temperature (new fluid or recycled fluid which is cooled due to transmittance to the outside of the printed circuit board) can be flowed into the printed circuit board, thereby increasing cooling efficiency of the printed circuit board.

Figure 8A:
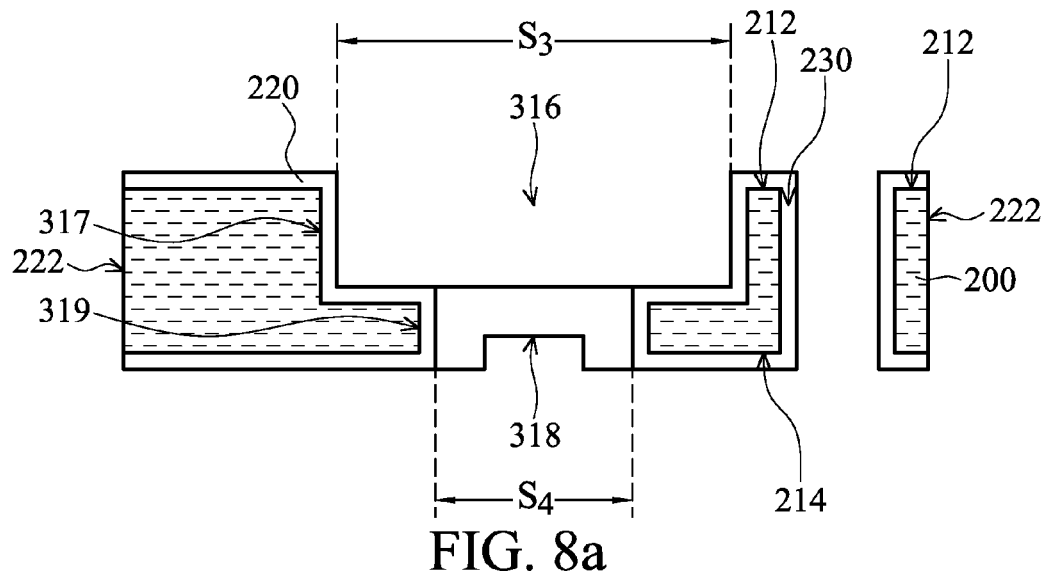
FIGS. 8a, 9, 10a, 11a, 12 and 13 are cross section views for fabricating another exemplary embodiment of a printed circuit board of the invention.
Figure 8B:
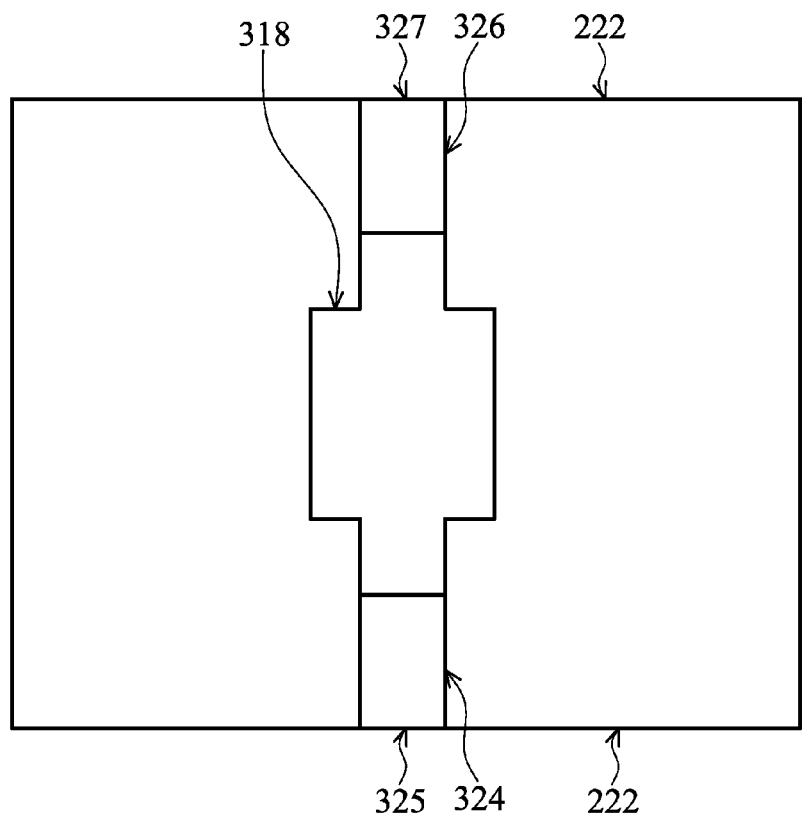

FIGS. 8a, 9, 10a, 11a, 12 and 13 are cross section views for fabricating another exemplary embodiment of a printed circuit board 500b of the invention. FIGS. 8b, 10b and 11b are bottom views of FIGS. 8a, 10a and 11a. A difference between the printed circuit boards 500a and 500b is that the entry and the outlet positions of the fluid (cooling liquid) of the printed circuit board 500b are different from those of the printed circuit board 500a. Elements of the embodiments hereinafter, that are the same or similar as those previously described with reference to FIGS. 1-6a and 6b, are not repeated for brevity. Please refer to FIGS. 8a and 8b, wherein a portion of the core substrate 200 is removed from the first surface 212 to form a first through hole 316 in the core substrate 200 by physical processes such as a mechanical drilling or a laser drilling process, and the first through hole 316 is formed from the first surface 212 and extends downward into the core substrate 200. Additionally, a portion of the a core substrate 200 is removed from the second surface 214 to form a second through hole 318, a first guide rail 324 and a second guide rail 326 in the core substrate 200, which are formed from the second surface 314, which extends upward into the core substrate 200, in the core substrate 200. As shown in FIG. 8a, the first through hole 316 and the second through hole 318 are laminated vertically and communicate with each other, and a first caliber $S_3$ of the first through hole 316 is larger than a second caliber $S_4$ of the second through hole 318. Also, as shown in FIG. 8b, the first guide rail 324 and the second guide rail 326 are respectively adjacent to a same side or different sides of the second through hole 318 and communicate with the second through hole 318. In one embodiment, heights and widths of the first guide rail 324 and the second guide rail 326 are all smaller than those of the second through hole 318. Note that a difference between the first guide rail 324 and the second guide rail 326 of the printed circuit board 500b as shown in FIG. 8b and the first guide rail 224 and the second guide rail 226 of the printed circuit board 500a as shown in FIG. 2b, is that a terminal opening 325 of the first guide rail 324 and terminal opening 327 of the second guide rail 326 are respectively on a side surface 222. Meanwhile, during the physical processes such as the mechanical drilling or laser drilling process, a through hole 230 may by formed through the core substrate 200.

Next, referring to FIGS. 8a and 8b again, a seed layer (not shown) and a first electroplated metal layer 220 may be sequentially formed by processes similar to the processes as shown in FIGS. 2a and 2b to cover the first surface 212, the second surface 214, an inner sidewall 317 of the first through hole 316, an inner sidewall 319 of the second through hole 318, the first guide rail 324, the second guide rail 326, and an inner sidewall of the through hole 230. In one embodiment, materials of the first electroplated metal layer 220 may be the same as those of the seed layer.

Figure 9:
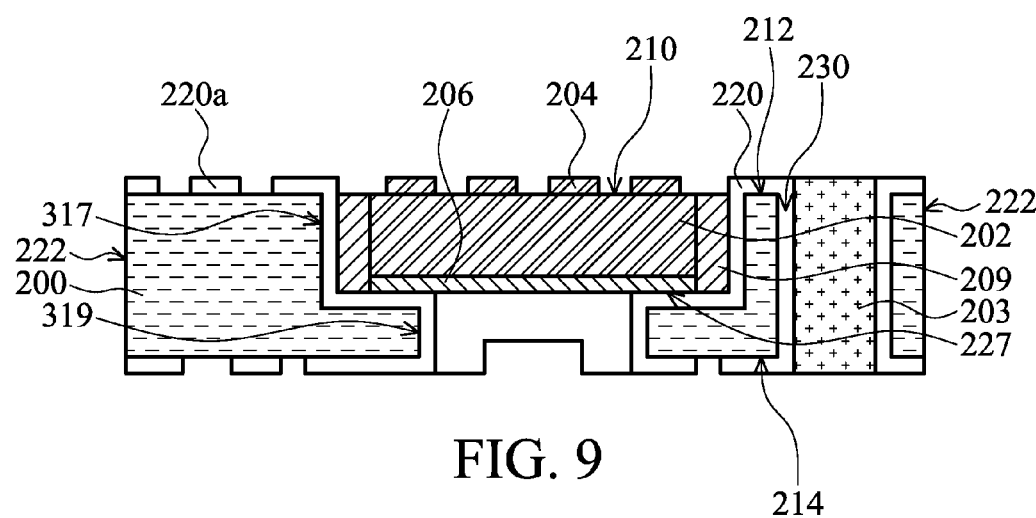

Next, referring to FIG. 9, the semiconductor device 202 as shown in FIG. 1 is disposed in the first through hole 216. Because the first caliber $S_3$ of the first through hole 316 may be larger than the second caliber $S_4$ of the second through hole 318, the semiconductor device 202 may be supported by a bottom surface 227 of the first through hole 316, and a portion of the heat conductive metal layer 206 may be exposed from the second through hole 318. As shown in FIG. 9, a heat conductive glue 209 can be used to fill a space between the semiconductor device 202 and the inner sidewall 317 of the first through hole 316. The heat conductive glue 209 is used to fix the semiconductor device 202 and facilitate the transmission of heat generated from the semiconductor device 202 to the adjacent first electroplated metal layer 220. Additionally, a through hole resin 203 may be formed in the through hole 230.

As shown in FIG. 9, a size of the semiconductor device 202 may be smaller than that of the first through hole 316, so that a heat conductive glue 209 can be used to fill a space between the semiconductor device 202 and the inner sidewall 317 of the first through hole 316. The heat conductive glue 209 is used to fix the semiconductor device 202 and facilitate the transmission of heat generated from the semiconductor device 202 to the adjacent first electroplated metal layer 220. Additionally, a through hole resin 203 may be formed in the through hole 230.

Next, referring to FIG. 9 again, a patterned first electroplated metal layer 220a is formed on the first surface 212 and the second surface 214 of the core substrate 200 by processes similar to the processes as shown in FIG. 3. The patterned first electroplated metal layer 220a may also serve as an internal circuit layer 220a.

Figure 10A:
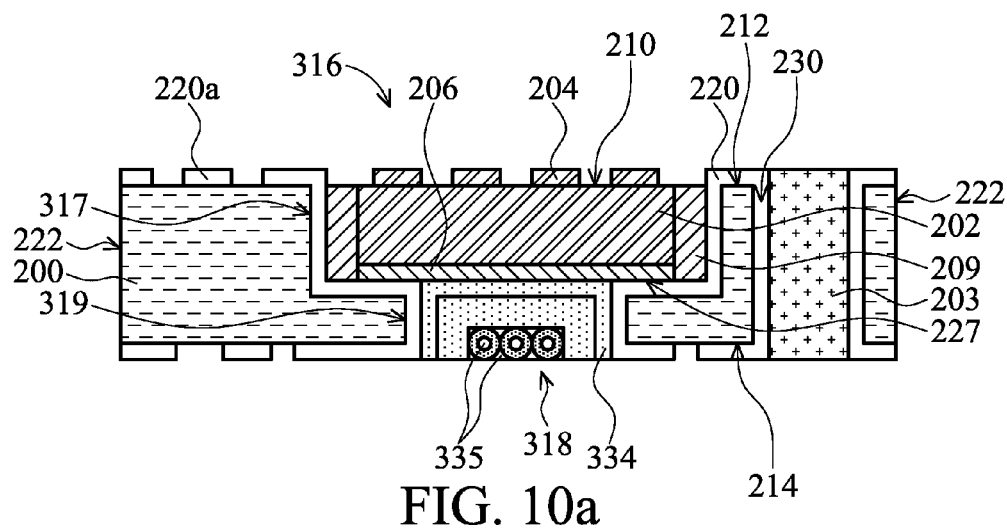
Figure 10B:
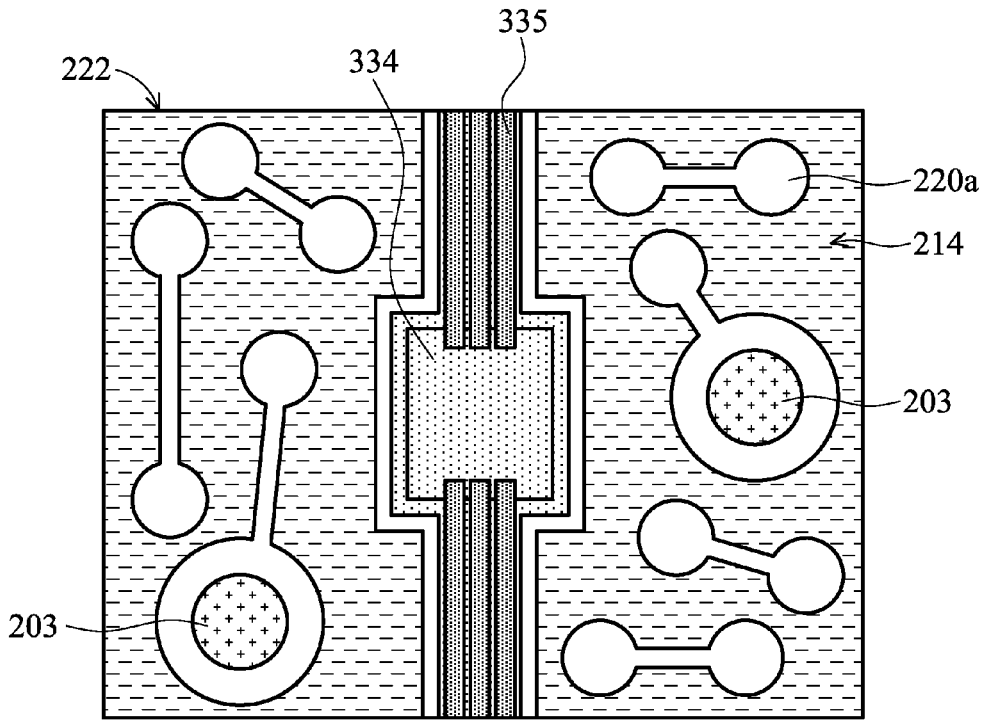

Next, referring to FIGS. 10a and 10b, a second electroplated metal layer 334 is formed on the patterned first electroplated metal layer 220a in the second through hole 318, the first guide rail 324 and the second guide rail 326 and the heat conductive metal layer 206 is exposed from the second through hole 318 by an electro plating process. Next, a fluid pipe 335 is optionally disposed in the first guide rail 324 or the second guide rail 326, wherein the fluid pipe 335 may extend into the second through hole 318.

Figure 11A:
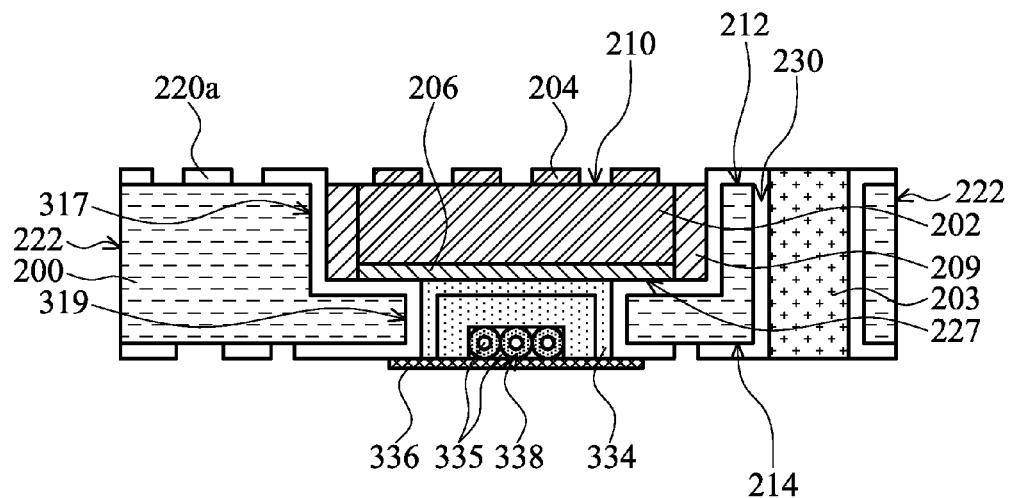
Figure 11B:
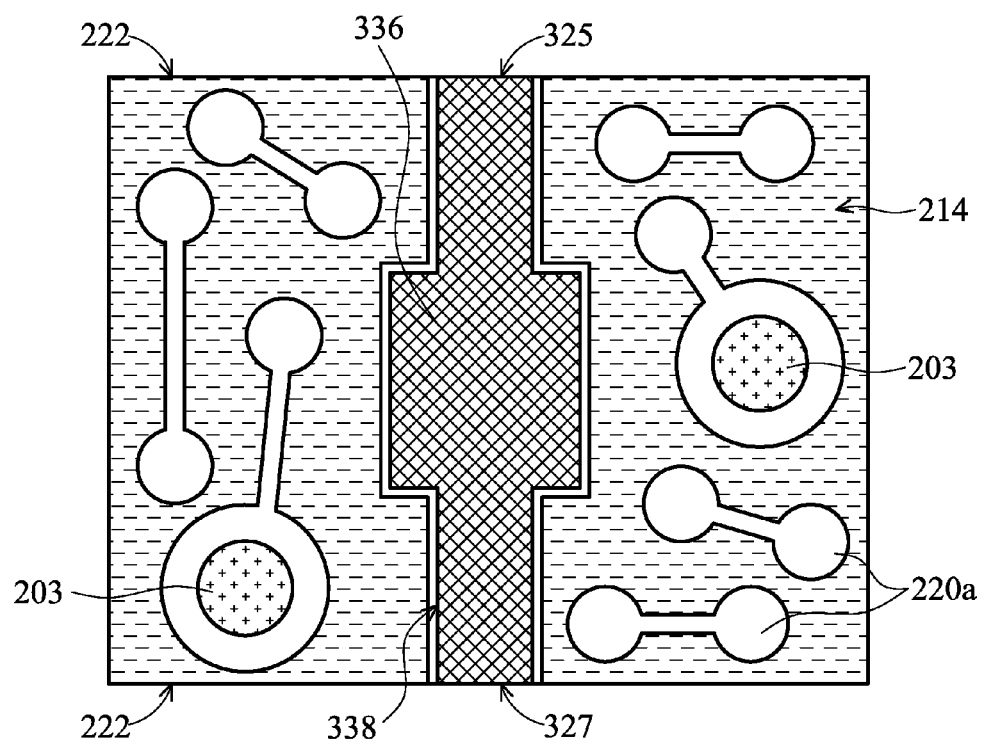

Next, referring to FIGS. 11a and 11b, a water resistant glue 336 is formed covering the second through hole 318, the first guide rail 324 and the second guide rail 326, extending to portions of the first electroplated metal layer 220a and the second electroplated metal layer 334 on the second surface 214 of the core substrate 200. The water resistant glue 336 contacts the second electroplated metal layer 334, covering the inner sidewalls of the second through hole 318, the first guide rail 324 and the second guide rail 326, and a space encircled by the water resistant glue 336 and the second electroplated metal layer 334 is formed as a flow path 338, thereby facilitating transmission of a fluid, which would flow therethrough the flow path 338 and cool core substrate 200, without the fluid permeating into the core substrate 200, wherein the flow path 338 has two terminal openings on the side surface 222 of the core substrate 200, respectively.

Figure 12:
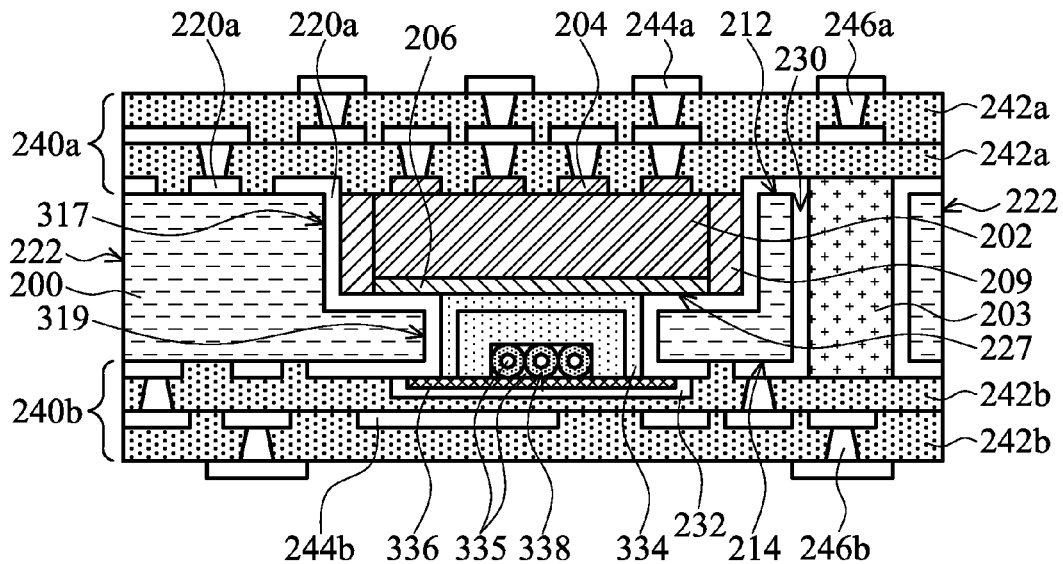

Next, referring to FIG. 12, a patterned photoresist (not shown) is formed on the second surface 214 of the core substrate 200 by an image transferring process, which comprises covering, developing, etching and stripping processes of a photoresist layer. All portions of the water resistant glue 336 and a portion of the first electroplated metal layer 220a adjacent to the water resistant glue 336 are exposed from the patterned photoresist (not shown). Next, a third electroplated metal layer 232 is formed on the water resistant glue 336, covering a portion of the first electroplated metal layer 220a adjacent to the water resistant glue 336 by an electro plating process. In one embodiment, the third electroplated metal layer 232 is used to enhance sealing ability provided by the water resistant glue 336, thereby facilitating transmission of a fluid, which would flow therethrough the flow path 338 and cool core substrate 200, without leaking out of the flow path 338. In one embodiment, the second electroplated metal layer 234, the first electroplated metal layer 220 and the third electroplated metal layer 232 may be formed by the same materials.

Next, referring to FIG. 12 again, a first additional circuit structure 240a and a second additional circuit structure 240b are respectively formed on the first surface 212 and second surface 214. The first additional circuit structure 240a covers the first through hole 316 and the semiconductor device 202, and the second additional circuit structure 240b covers the second through hole 318, the first guide rail 324 and the second guide rail 326. The first additional circuit structure 240a may comprise a plurality of insulating layers 242a, which are laminated vertically, a plurality of patterned circuit layers 244a formed between the insulating layers 242a and a plurality of conductive blind holes 246a, which are used to electrically connect to the patterned circuit layers 244a of different levels, through the insulating layers 242a. Similarly, the second additional circuit structure 240b may comprise a plurality of insulating layers 242b, which are laminated vertically, a plurality of patterned circuit layers 244b formed between the insulating layers 242b and a plurality of conductive blind holes 246b, which are used to electrically connect to the patterned circuit layers 244b of different levels, through the insulating layers 242b. The first additional circuit structure 240a and the second additional circuit structure 240b electrically connect to the conductive pads 204 of the semiconductor device 202 through the patterned circuit layers 244a, 244b and the blind holes 246a, 246b.

Figure 13:
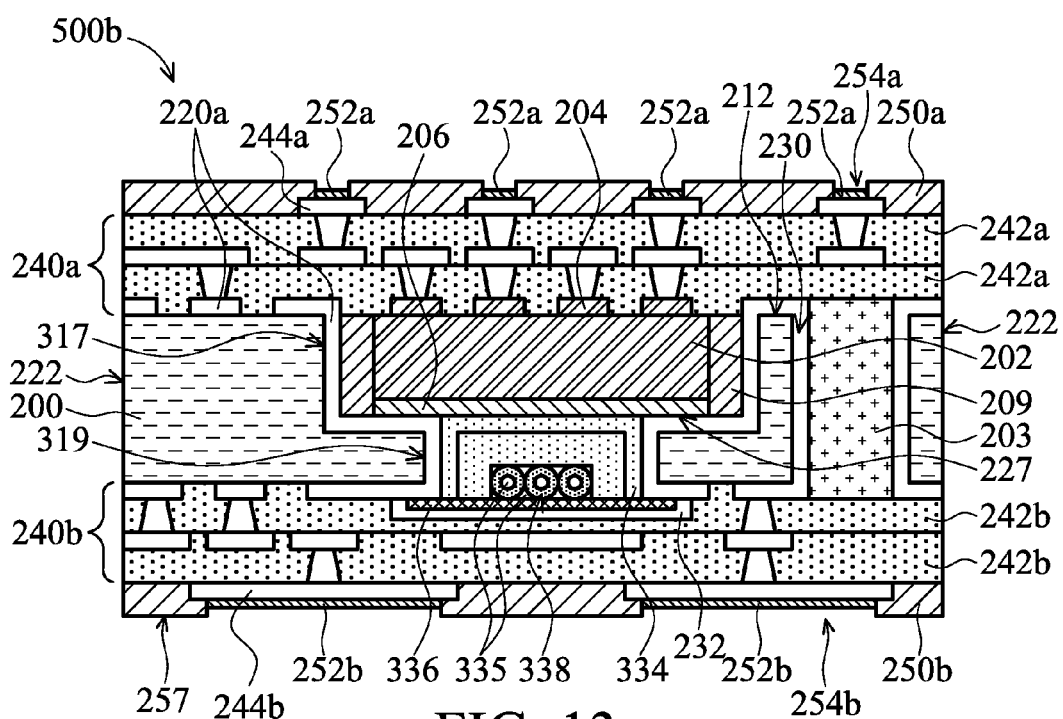

Next, referring to FIG. 13, solder resistance insulating layers 250a and 250b having a plurality of openings 254a and 254b may be formed, respectively on the first additional circuit structure 240a and the second additional circuit structure 240b by processes similar to the processes as shown in to FIGS. 6a and 6b. Next, metal protection layers 252a and 252b are, respectively formed on the patterned circuit layers 244a and 244b, respectively exposed from the openings 254a and 254b. Note that the description of another exemplary embodiment of a printed circuit board 500b of the invention has been completed.

Figure 14:
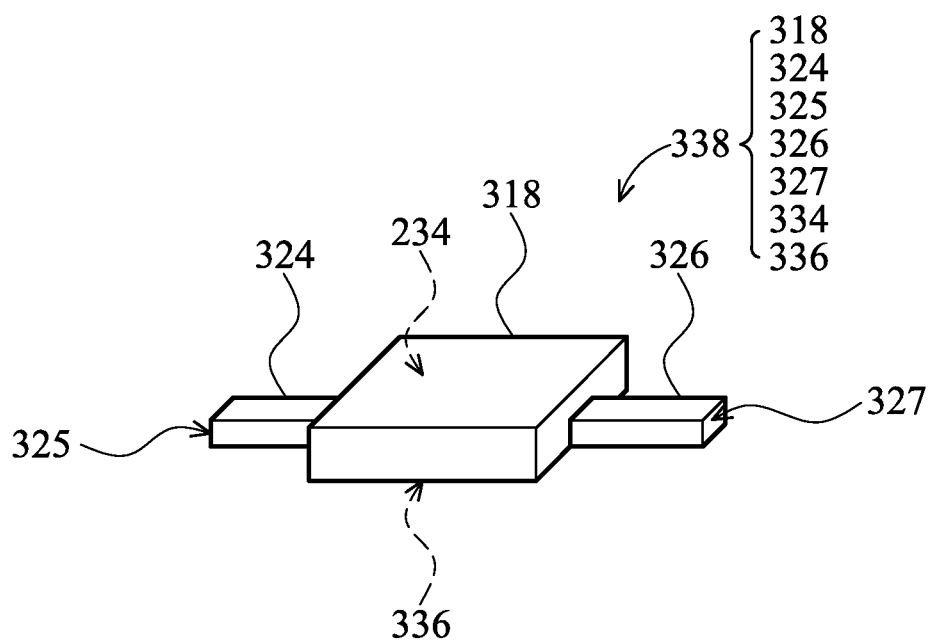
FIG. 14 is a three-dimensional schematic view showing a flow path formed by a second through hole, a first guide rail and a second guide rail of another exemplary embodiment of a printed circuit board of the invention.

FIG. 14 is a three-dimensional schematic view of a flow path 338, of another exemplary embodiment of a printed circuit board 500b of the invention, wherein the flow path 338 comprising the second through hole 318, the first guide rail 324 and the second guide rail 326, which are covered by the water resistant glue 336, and the second electroplated metal layer 334 to facilitate a fluid having a cooling function, for example, methanol or water, flows sequentially from an outside of the printed circuit board (the terminal opening 325, which serves as an entry point of the fluid) through the first guide rail 324, the second through hole 318, and the second guide rail 326 to the outside of the printed circuit board (the terminal opening 327, which serves as an outlet of the fluid) in sequence, so that heat generated from the semiconductor device 202 disposed in the first through hole 316 is transmitted to the outside of the printed circuit board. It is to be understood that the invention is not limited to the disclosed embodiments. Alternatively, the terminal opening 327 may serve as an entry point of the fluid and the terminal opening 325 may serve as an outlet of the fluid. Therefore, the printed circuit board 500b may communicate with an additional fluid circulation cooling device such as a cooling pump, so that the fluid in the printed circuit board can be transmitted to the outside of the printed circuit board to increase a cooling efficiency. Also, fluid with a lower temperature (new fluid or recycled fluid which is cooled due to transmittance to the outside of the printed circuit board) can be flowed into the printed circuit board, thereby increasing cooling efficiency of the printed circuit board.

Exemplary embodiments of printed circuit boards 500a and 500b of the invention comprise through holes recessed in a core substrate. Therefore, semiconductor devices can be buried into the core substrate to increase wiring area of the substrate. The printed circuit boards 500a and 500b may facilitate fabrication of a three-dimensional semiconductor device package structure, wherein an increased number of semiconductor devices can be packaged therein. Additionally, exemplary embodiments of the printed circuit boards 500a and 500b of the invention comprise a flow path (formed by the through holes and the guide rails) communicating with the outside of the printed circuit board (the terminal openings may be formed on the side surface of the core substrate or the top surface of the solder mask resistance layer), wherein the through hole, which is a portion of the flow path, and the through hole for the semiconductor device embedded therein are laminated vertically from each other, so that heat generated from the semiconductor device disposed in the core substrate is transmitted to the outside of the printed circuit boards 500a and 500b. Compared to the conventional printed circuit boards without flow paths, the exemplary embodiment of the printed circuit board of the invention may utilize fluid, having a cooling function, so that more heat can be transmitted to the outside of the printed circuit board, to improve cooling efficiency of the printed circuit board. Accordingly, the printed circuit board for buried in components formed according to the exemplary embodiment of the printed circuit board of the invention has improved reliability. Additionally, the printed circuit boards 500a and 500b are not limited by the number of through holes for the semiconductor devices buried therein, thereby allowing a plurality of the semiconductor devices to be buried therein. Heat from the semiconductor devices can be transmitted to walls of the through holes and guide rails through the inner circuits, thereby being transmitted to the outside of the printed circuit board by the fluid flowing in the flow path.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A printed circuit board, comprising:
a core substrate having a first surface and an opposite second surface;
a first through hole and a second through hole formed through a portion of the core substrate, respectively, from the first surface and second surface, wherein the first and second through holes are laminated vertically and communicate with each other; and
a first guide rail and a second guide rail, respectively, formed through a portion of the core substrate and communicating with the second through hole, so that a fluid flows from an outside of the printed circuit board through the first guide rail, the second through hole and the second guide rail, to the outside of the printed circuit board in sequence, and heat generated from a semiconductor device disposed in the first through hole is transmitted to the outside of the printed circuit board.

2. The printed circuit board as claimed in claim 1, further comprising a first additional circuit structure and a second additional circuit structure, respectively, disposed on the first surface and second surface, respectively covering the first through hole, the second through hole, the first guide rail and the second guide rail, wherein the first and second additional circuit structures electrically connect to the semiconductor device.

3. The printed circuit board as claimed in claim 2, wherein a first caliber of the first through hole is larger than a second caliber of the second through hole.

4. The printed circuit board as claimed in claim 2, further comprising:
a first electroplated metal layer covering inner sidewalls of the first through hole, the second through hole, the first guide rail and the second guide rail;
a heat conductive metal layer disposed on a bottom surface of the semiconductor device, wherein a portion of the heat conductive metal layer is exposed from the second through hole; and
a second electroplated metal layer covering the first electroplated metal layer in the second through hole, the first guide rail and the second guide rail, wherein the heat conductive metal layer is exposed from the second through hole;
a water resistant glue covering the second through hole, the first guide rail and the second guide rail, wherein a space encircled by the water resistant glue and the second electroplated metal layer forms a flow path; and
a third electroplated metal layer covering the resistant glue.

5. The printed circuit board as claimed in claim 4, wherein the second additional circuit structure further comprises:
- a first flow path hole and a second flow path hole, respectively, communicating with the first guide rail and the second guide rail, wherein a terminal opening of the first flow path hole and a terminal opening of the second flow path hole, are respectively on a top surface of the second additional circuit structure; and
- a fourth electroplated metal layer and a fifth electroplated metal layer, respectively, covering inner sidewalls of the first flow path hole and a second flow path hole.

6. The printed circuit board as claimed in claim 1, wherein a terminal opening of the first guide rail and a terminal opening of the second guide rail are on a side surface of the core substrate, respectively.

7. The printed circuit board as claimed in claim 1, wherein widths of the first guide rail and the second guide rail are smaller than that of the second through hole.

8. The printed circuit board as claimed in claim 6, wherein heights and widths of the first guide rail and the second guide rail are smaller than those of the second through hole.

9. The printed circuit board as claimed in claim 1, further comprises a fluid pipe disposed in the first guide rail or the second guide rail.

10. A method for fabricating a printed circuit board, comprising:
- providing a core substrate having a first surface and an opposite second surface;
- removing a portion of the core substrate from the first surface to form a first through hole in the core substrate; and
- removing a portion of the core substrate from the second surface to form a second through hole, a first guide rail and a second guide rail in the core substrate, wherein the first and second through holes are laminated vertically and communicate with each other, and the first guide rail and the second guide rail, respectively, communicate with the second through hole, so that a fluid flows from an outside of the printed circuit board through the first guide rail, the second through hole and the second guide rail, to the outside of the printed circuit board in sequence, so that heat generated from a semiconductor device disposed in the first through hole is transmitted to the outside of the printed circuit board.

11. The method for fabricating a printed circuit board as claimed in claim 10, further comprising:
- forming a first electroplated metal layer on inner sidewalls of the first through hole, the second through hole, the first guide rail and the second guide rail, before disposing the semiconductor device in the first through hole.

12. The method for fabricating a printed circuit board as claimed in claim 11, further comprising a heat conductive metal layer disposed on a bottom surface of the semiconductor device, wherein a portion of the heat conductive metal layer is exposed from the second through hole.

13. The method for fabricating a printed circuit board as claimed in claim 12, further comprising:
- forming a second electroplated metal layer on the first electroplated metal layer in the second through hole, the first guide rail and the second guide rail, wherein the heat conductive metal layer is exposed from the second through hole after the semiconductor device is disposed in the first through hole;
- forming a water resistant glue covering the second through hole, the first guide rail and the second guide rail, wherein a space encircled by the water resistant glue and the second electroplated metal layer forms a flow path; and
- forming a third electroplated metal layer covering the resistant glue.

14. The method for fabricating a printed circuit board as claimed in claim 13, further comprising:
- forming a first additional circuit structure and a second additional circuit structure, respectively, on the first surface and the second surface. respectively covering the first through hole, the second through hole, the first guide rail and the second guide rail, wherein the first and second additional circuit structures electrically connect to the semiconductor device after the third electroplated metal layer is formed.

15. The method for fabricating a printed circuit board as claimed in claim 14, wherein forming the second additional circuit structure further comprises:
- forming a first flow path hole and a second flow path hole, respectively, communicating with the first guide rail and the second guide rail, wherein a terminal opening of the first flow path hole and a terminal opening of the second flow path hole, are respectively on a top surface of the second additional circuit structure; and
- forming a fourth electroplated metal layer and a fifth electroplated metal layer, respectively covering inner sidewalls of the first flow path hole and a second flow path hole.

16. The method for fabricating a printed circuit board as claimed in claim 10, wherein a terminal opening of the first guide rail and a terminal opening of the second guide rail are on a side surface of the core substrate, respectively.

* * * * *